United States Patent [19]
Avery

[11] Patent Number: 5,969,923
[45] Date of Patent: Oct. 19, 1999

[54] ELECTROSTATIC PROTECTION STRUCTURE FOR MOS CIRCUITS

[75] Inventor: Leslie Ronald Avery, Flemington, N.J.

[73] Assignees: Sarnoff Corporation, Princeton, N.J.; Sharp K.K., Osaka, Japan

[21] Appl. No.: 08/892,933

[22] Filed: Jul. 15, 1997

[51] Int. Cl.$^6$ ..................................................... H02H 9/00
[52] U.S. Cl. .......................... 361/56; 361/111; 361/118; 361/127
[58] Field of Search ............................... 361/56, 58, 111, 361/113, 91, 103, 127, 118

[56] References Cited

U.S. PATENT DOCUMENTS

| 4,419,150 | 12/1983 | Soclof | 148/187 |
|---|---|---|---|
| 4,656,491 | 4/1987 | Igarashi | 357/23.13 |
| 5,229,635 | 7/1993 | Bessolo et al. | 257/360 |
| 5,293,057 | 3/1994 | Ho et al. | 257/356 |
| 5,644,460 | 7/1997 | Clukey | 361/56 |

*Primary Examiner*—Stephen W Jackson
*Attorney, Agent, or Firm*—William J. Burke

[57] ABSTRACT

An ESD protection circuit includes a pair of NPN lateral transistors electrically connected in series with the emitter of one of the transistors electrically connected to the collector of the other transistor. The bases of the two transistors are electrically connected together and are floating. The two transistors may be provided by two MOS transistors having N-type source and drains and P-type channel regions. The channels regions are connected together and are floating.

10 Claims, 4 Drawing Sheets

5,969,923

ELECTROSTATIC PROTECTION STRUCTURE FOR MOS CIRCUITS

FIELD OF THE INVENTION

The present invention is directed to an electrostatic (ESD) protection structure for circuits having MOS transistors, and, more particularly to a dual gate ESD protection structure for SIMOX integrated circuits.

BACKGROUND OF THE INVENTION

One type of integrated circuit which has been recently developed comprises a thin layer of single crystalline silicon extending over and insulated from the surface of a silicon substrate. This type of integrated circuit is called a "SIMOX" device. Circuit are formed in the thin layer of silicon by forming various electrical components, such as transistors, in the thin layer. One method of making a SIMOX device is to implant oxygen ions into the surface of a substrate of single crystalline silicon so that the oxygen ions are spaced from the surface of the substrate. The substrate is then heated so that the oxygen ions react with the silicon and form a thin layer of silicon dioxide beneath the surface of the substrate with a thin layer of the silicon extending over the oxide layer.

CMOS circuits formed in a SIMOX device which has fully depleted NMOS and PMOS transistors having relatively low breakdown voltages when the transistors are operated in the "floating body" mode. Connecting the body to the source of the transistors substantially increased the breakdown voltage. When an NMOS transistor is used as an ESD protection structure, it is normal to connect the gate of the NMOS to the source. This is often referred to as a grounded-gate NMOS, or ggNMOS. The structure actually providing the ESD protection is the parasitic bipolar NPN transistor inherently formed by the NMOS transistor. The gate of the NMOS transistor merely serves to determine the emitter-collector spacing, and to a small extent, to control the trigger voltage. Once impact ionization occurs at the base-collector junction, avalanche multiplication results in the sudden reduction in collector-emitter voltage to a substantially lower level than the initial breakdown voltage. This phenomenon is sometimes referred to as snap-back.

Premature failure of a protection structure can occur in devices with large differences between the trigger and snap-back voltages if one section (of a multi-section) of the protection structure turns on first. This is because the voltage across the terminals drops to the snap-back holding voltage, and the "on" segment passes all of the current, preventing the voltage across the other sections reaching the required snap-back trigger voltage. It is common practice to add resistance in series with each segment, so that if one section "fires" the voltage drop across an "on" segment, plus the voltage across the series resistor, will allow the other segments to achieve the required trigger voltage. However, if the difference between the trigger and snap-back voltages is large, this approach requires an undesirably high series resistance. The ideal ESD protection structure would have virtually no leakage current prior to the trigger voltage, and almost no difference between the trigger and snap-back voltages.

During the development of a 0.35 micron SIMOX ESD protection device, it was found that ggNMOS devices with a floating body had virtually identical trigger and snap-back voltages, but relatively high leakages. Also, process spreads sometimes resulted in the snap-back holding voltage being below the maximum supply voltage used during burn-in of the product. Clearly, this was an undesirable situation. Connecting the body of the device to the source and gate eliminated the leakage problem, but doubled the trigger voltage while not affecting the snap-back voltage. A longer gate length (wider NPN base) did not substantially alter the device characteristics. Therefore, a modification of the structure was necessary to achieve the desired ESD protection characteristics.

SUMMARY OF THE INVENTION

The present invention is directed to an ESD protection circuit which includes a pair of lateral NPN transistors each having an emitter, collector and base. The transistors are connected in series with the emitter of one transistor being connected to the collector of the other transistor. A terminal is connected to the collector of one transistor and a terminal is connected to the emitter of the other transistor. The bases of the two transistors are connected together and are floating.

Another aspect of the present invention is a semiconductor device forming an ESD protection circuit. The semiconductor device includes a substrate of single crystalline silicon having a surface. A layer of an insulating material is on the surface of the substrate and a thin layer of single crystalline silicon is on the insulating layer. A pair of NPN lateral transistors are in the silicon layer with each transistor having a spaced pair of N+ type conductivity regions with a P− type conductivity region between and contacting the N+ type regions. One of the N+ type regions of one of the transistors is electrically connected to one of the N+ type regions of the other transistor, and means are provided which electrically connects the P-type regions together.

DETAILED DESCRIPTION

Figure 1:
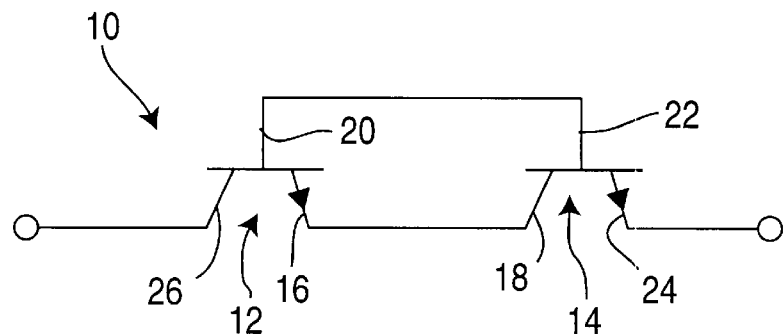
FIG. 1 is a circuit diagram showing the ESD protection circuit of the present invention.
Figure 7:
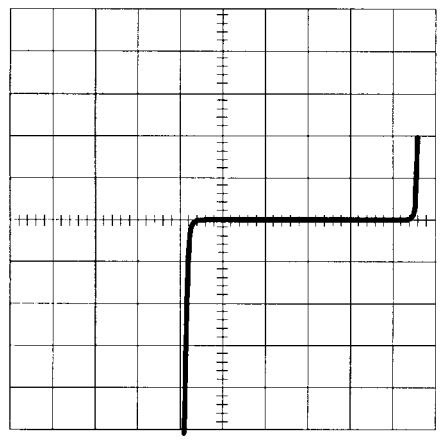
FIG. 7 is a graph showing the I/V characteristics of a prior art dual gate device having individually floating bodies.
Figure 8:
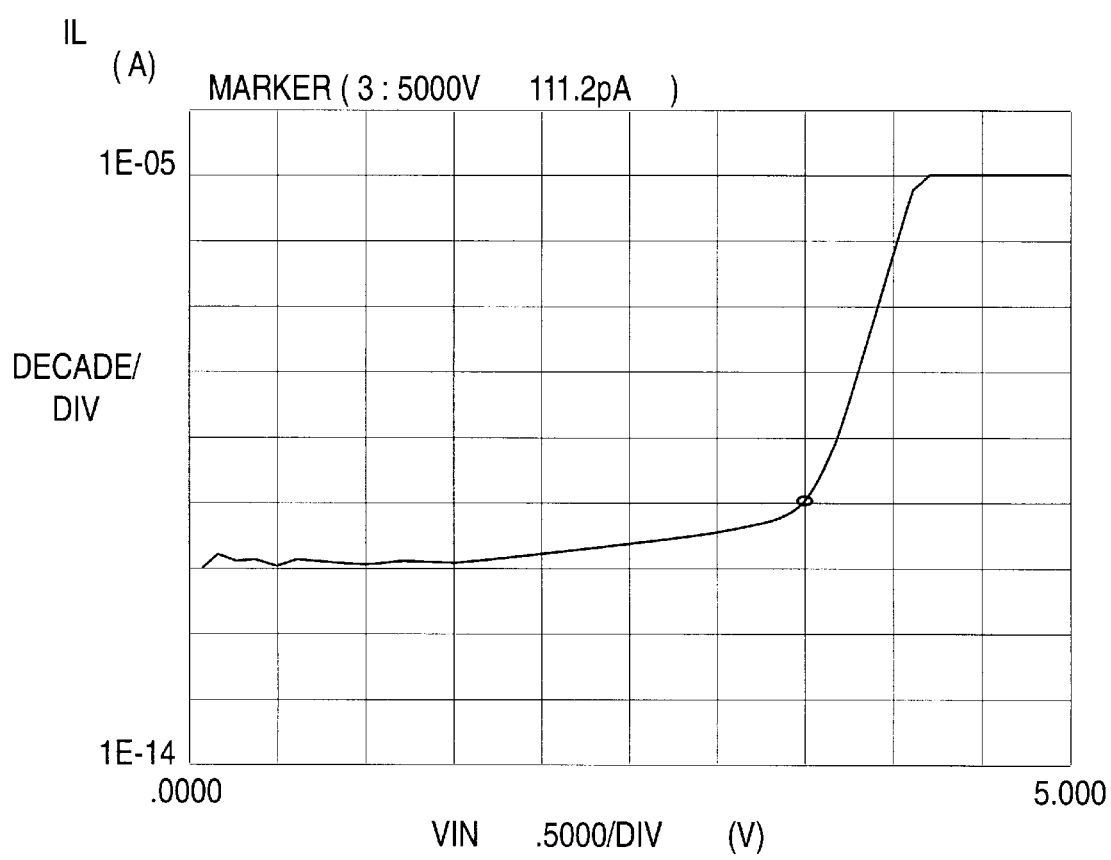
FIG. 8 is a graph showing the corresponding leakage current characteristics of the device having the I/V characteristics shown in FIG. 7.
Figure 9:
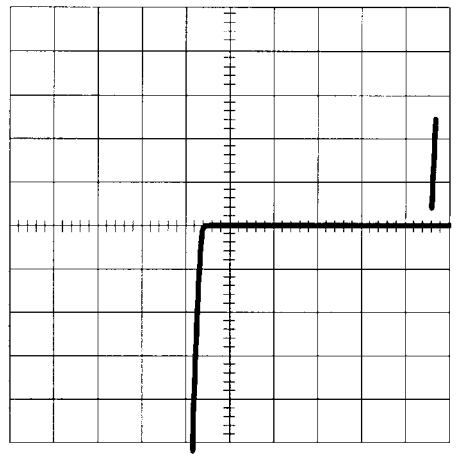
FIG. 9 is a graph showing the I/V characteristics of a dual gate device of the present invention in which the bodies are coupled together and are floating.
Figure 10:
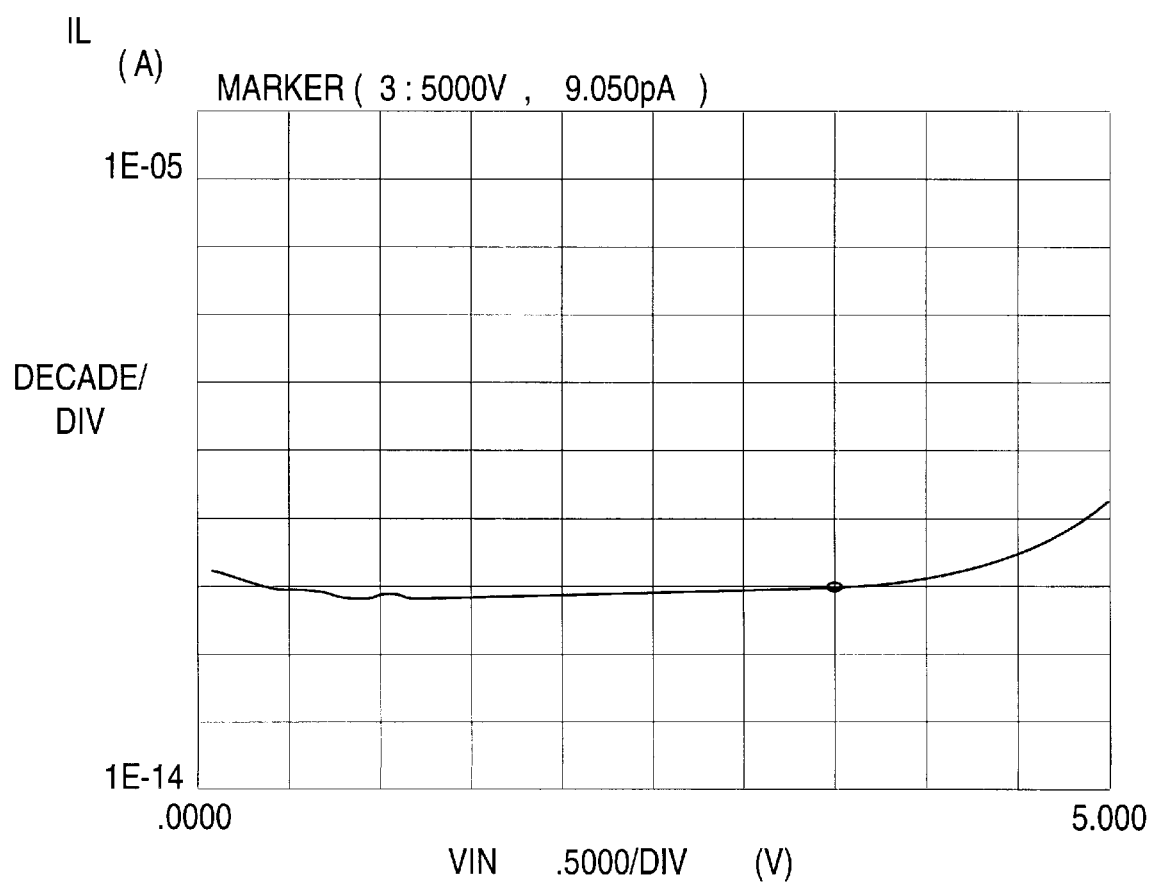
FIG. 10 is a graph showing the corresponding leakage current characteristics of the device having the I/V characteristics shown in FIG. 9.

Referring initially to FIG. 1, one form of the SIMOX ESD protection circuit of the present invention is generally designated as 10. ESD protection circuit 10 comprises two stacked lateral NPN transistors 12 and 14 in which the emitter 16 of the transistor 12 is connected to the collector 18 of the transistor 14. The bases 20 and 22 of the two transistors 12 and 14 are connected together and allowed to "float". The emitter 24 of the transistor 14 serves as one terminal of the protection circuit 10 and the collector 26 of the transistor 12 serves as a second terminal of the protection circuit 10. In the protection circuit 10, by having the bases 20 and 22 of the transistors 12 and 14 connected together and allowed to "float", the leakage current is reduced by ensuring an equal division of the voltage, without substantially raising the trigger voltage. By comparing FIG. 9 to FIG. 7 and FIG. 10 to FIG. 8 it can be seen that this then achieves the desirable characteristics of low leakage current and virtually equal trigger and snap-back voltage. As shown in FIG. 9, the device of the present invention has I/V characteristics similar to those of the prior art device shown in FIG. 7. However, as shown in FIG. 10, the device of the present invention has much lower leakage current than the prior art device as shown in FIG. 7.

Figure 2:
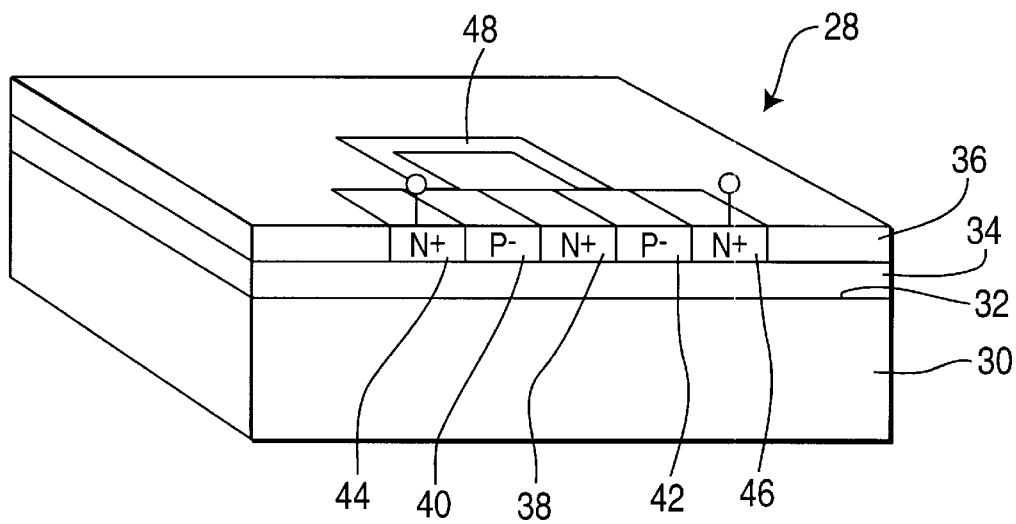
FIG. 2 is a perspective view of a portion of a SIMOX device showing one form of the ESD protection circuit of the present invention.

Referring to FIG. 2, there is shown one manner of achieving the circuit 10 in a SIMOX device 28. SIMOX device 28 comprises a substrate 30 of single crystalline silicon having along a surface 32 thereof a thin layer 34 of an insulating material, such as silicon dioxide. Over the insulating material layer 34 is a thin layer 36 of single crystalline silicon. The silicon layer 36 is separated in a plurality of separate regions which are electrically isolated from each other. Thus, devices formed in the various regions of the silicon layer are electrically isolated from each other. The electrical isolation is generally achieved by oxidizing portions of the silicon layer 36 to form areas of silicon oxide between the silicon regions. In FIG. 1, only one silicon region is shown with the ESD protection circuit 10 being formed therein.

In the silicon layer 36 is a region 38 of highly conductive N–type conductivity (N+ type). On each side of the N+ type region 38 and contacting the N+ type region 38 is a separate region 40 and 42 of P– type conductivity. At the side of each of the P– type regions 40 and 42 opposite the N+ region 38 is a region 44 and 46, respectively, of N+ type conductivity.

The N+ region 38, P– region 40 and N+ region 44 form one lateral NPN transistor, and the N+ region 38, P– region 42 and N+ region 46 form a second lateral NPN transistor. The N+ region 38 serves as the emitter of one of the transistors and the collector of the other transistor. A strip 48 of highly conductivity P– type conductivity (P+ type) is in the silicon layer 36 and extends between the P– type regions 40 and 42 to electrically connect the bases of the transistors. Thus, the device 28 forms the ESD protection circuit 10 shown in FIG. 1.

Figure 3:
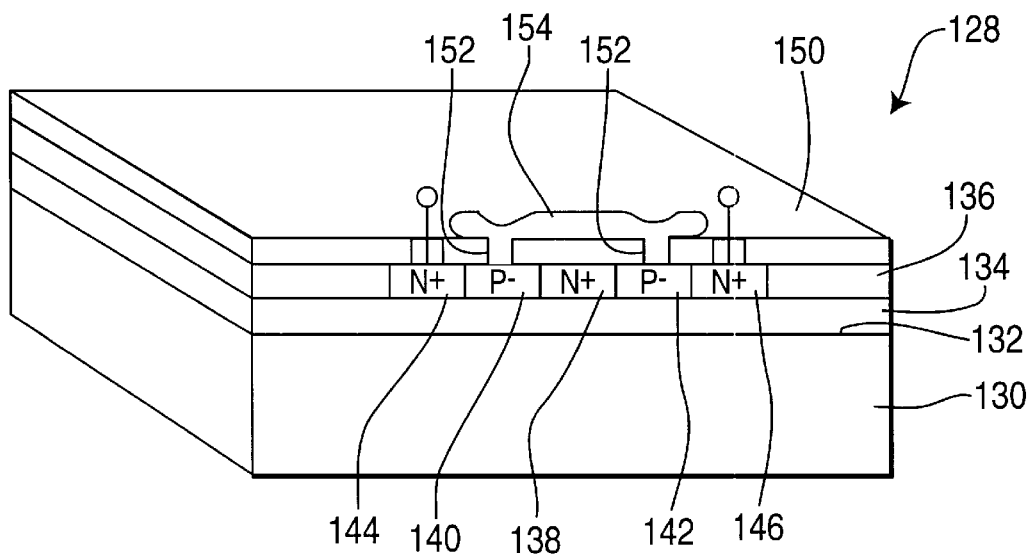
FIG. 3 is a perspective view of a portion of a SIMOX device showing another form of the ESD protection circuit of the present invention.

Referring to FIG. 3, there is shown another form of a device 128 of the present invention which forms the ESD protection circuit 10. Device 128 comprises a substrate 130 of single crystalline silicon having on a surface 132 thereof a thin layer 134 of an insulating material, such as silicon dioxide. On the insulating material layer 134 is a thin layer 136 of single crystalline silicon. In the silicon layer 136 is a highly conductive N–type region 138 (N+ type) which serves as the emitter of one transistor and the collector of a second transistor. On each side of and contacting the N+ type region 138 are separate P– type regions 140 and 142 which are the bases of the two transistors. At the side of the P– type region 140 opposite the N+ type region 138 is a N+ type region 144, and at the side of the P– type region 142 opposite the N+ type region 138 is a N+ type region 146. The N+ type regions 144 and 146 contact their respective P– type regions 140 and 142. The N+ region 144 serves as the collector of the one transistor, and the N+ type region 146 serves as the emitter of the second transistor. A layer 150 of an insulating material, such as silicon dioxide, is on the silicon layer 136 and has a separate opening 152 therethrough over and to each of the P– type regions 140 and 142. A strip 154 of a conductive metal is on the insulating layer 150 and extends into the openings 152 to contact the P– type regions 140 and 142. Thus, the metal strip 154 electrically connects the bases, the P– type regions 140 and 142, of the two transistors. Thus, the device 128 forms the ESD protection circuit 10.

Figure 4:
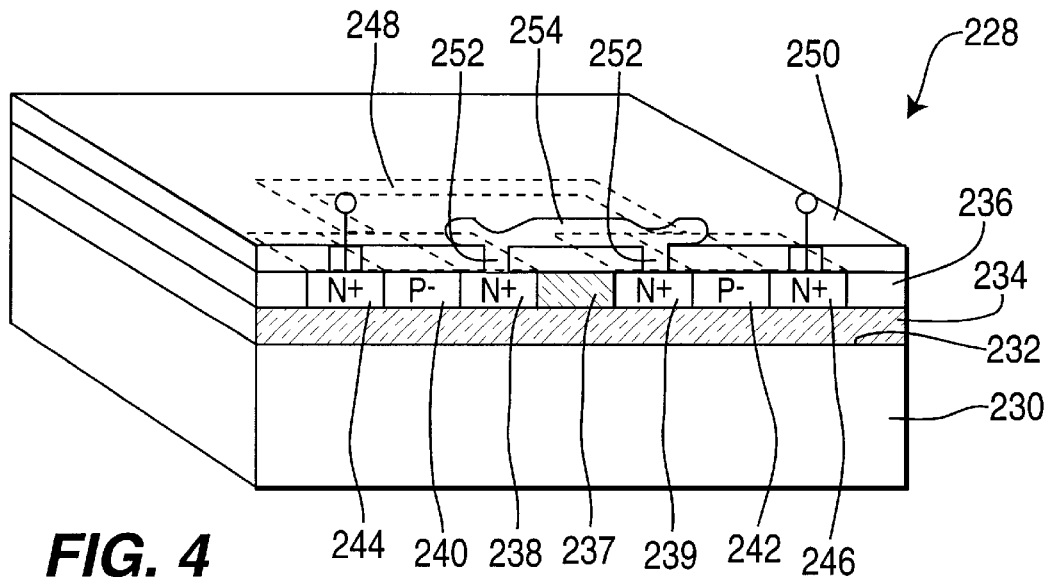
FIG. 4 is a perspective view of a portion of a SIMOX device showing a third form of the ESD protection circuit of the present invention.

Referring to FIG. 4, there is shown another form of a device 228 of the present invention which forms the ESD protection circuit 10. The device 228 comprises a substrate 230 of single crystalline silicon having a surface 232. On the surface 232 of the substrate 230 is a layer 234 of an insulating material, such as silicon dioxide. On the insulating layer 234 is a thin layer 236 of single crystalline silicon. As described with regard to the device 28 shown in FIG. 2, the silicon layer 236 shown in FIG. 4 is merely one region of a larger layer of silicon which is separated into individual regions by insulating portions formed in the silicon layer. In the silicon layer 236 are two slightly spaced apart highly conductive N–type conductivity (N+ type) regions 238 and 239. Between the N+ type regions 238 and 239 is a insulating region 237 of silicon dioxide which isolates the N+ type regions 238 and 239 from each other. At the side of the N+ type region 238 opposite the N+ type region 239 is a P– type region 240, and at the side of the N+ type region 239 opposite the N+ type region 238 is a P– type region 242. The P– type regions 240 and 242 contact their respective N+ type regions 238 and 239. On the side of the P– type region 240 opposite the N+ type region 238 is a N+ type region 244, and on the side of the P– type region 242 opposite the N+ type region 239 is a N+ type region 246. The N+ type regions 244 and 246 contact their respective P– type regions 240 and 242. A P+ type strip 248 is in the silicon layer 236 and extends between the P– type regions 240 and 242 to electrically connect the P– type regions 240 and 242. A layer 250 of an insulating material, such as silicon dioxide is on the silicon layer 236 and has a separate opening 252 therethrough over and to each of the N+ type regions 238 and 239. A strip 254 of a conductive metal is on the insulating layer 250 and extends into the openings 252 to contact the N+ type regions 238 and 239. Thus, the metal strip 254 electrically connects the N+ type regions 238 and 239. This forms the ESD protection circuit 10. Although the P– type regions are shown as being electrically connected by a P+ strip in the silicon layer 236, they can be connected by a metal strip such as are the N+ type regions 238 and 239.

Figure 5:
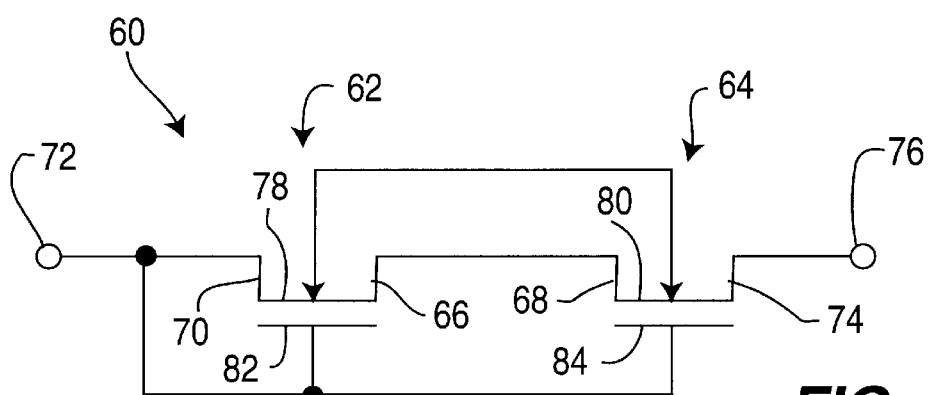
FIG. 5 is a circuit diagram of the ESD protection circuit of the present invention formed with MOS transistors.

Referring to FIG. 5, there is shown another form 60 of the ESD protection circuit of the present invention. ESD protection circuit 60 comprises first and second MOS transistors 62 and 64. MOS transistor 62 has a drain 66 which is electrically connected to the source 68 of the MOS transistor 64. The source 70 of the MOS transistor 62 is connected to a first terminal 72, and the drain 74 of the MOS transistor 64 is connected to a second terminal 76. The channel regions 78 and 80 of the MOS transistors 62 and 64 are electrically connected together and are floating. The gates 82 and 84 of the MOS transistors 62 and 64 are electrically connected together and to the first terminal 72. The MOS transistors 62 and 64 have N+ type conductivity source and drains and P– type conductivity channel regions 78 and 80. Thus, each MOS transistor 62 and 64 forms a NPN lateral bipolar transistor. The channel regions 78 and 80 are connected together and are floating, and the gates 82 and 84 are connected together and to the first terminal. Thus, the ESD protection circuit 60 forms the same circuit as the ESD protection circuit 10 shown in FIG. 1 and operates in the same manner.

Figure 6:
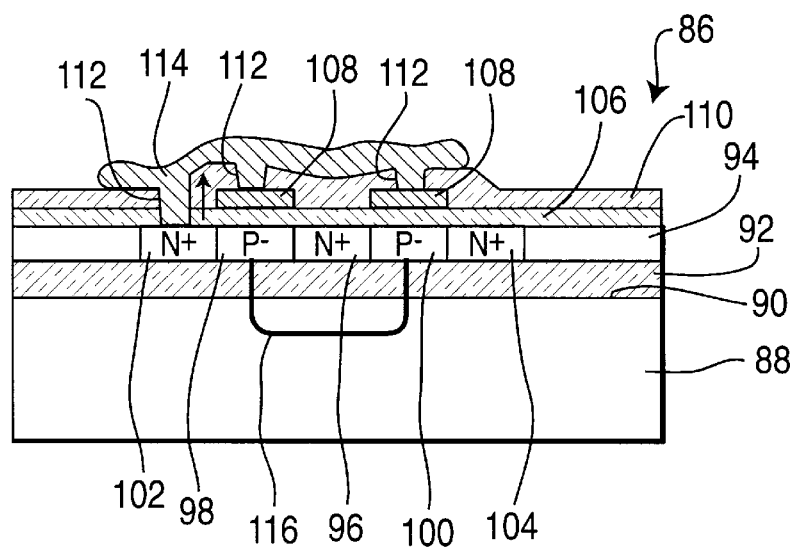
FIG. 6 is a sectional view of a portion of a SIMOX semiconductor device forming the ESD protection circuit of FIG. 5.

Referring to FIG. 6, there is shown one form of a semiconductor device 86 which forms the ESD protection circuit 10 of the present invention. Semiconductor device 86 comprises a substrate 88 of single crystalline silicon having a surface 90. On the surface 90 of the substrate 88 is a thin layer 92 of an insulating material, such as silicon dioxide. On the insulating layer 92 is a thin layer 94 of single crystalline silicon. In the silicon layer 94 is a N+ type conductivity region 96. At each side of and contacting the N+ type region 96 is a P– type region 98 and 100. At the side of the P– type region 98 opposite the N+ type region 96 is a N+ type region 102, and on the side of the P– type region 100 opposite the N+ type region 96 is a N+ type region 104. Each of the N+ type regions 102 and 104 contact its respective P– type region 98 and 100. A thin layer 106 of an insulating material, such as silicon dioxide, is over the P– type regions 98 and 100, and a layer 108 of a conductive material, such as doped polycrystalline silicon, is on the insulating layer 106 over each of the P– type regions 98 and 100. The conductive layers 108 form the gates of the MOS transistors. A layer 110 of an insulating material, such as silicon dioxide, is over the conductive layers 108 and the N+ type regions 96, 102 and 104. The insulating layer 110 has openings 112 therethrough over the conductive layers 108 and the N+ type region 102. A strip 114 of a conductive material, such as a metal, is on the insulating layer 110 and extends into the openings 112 to contact the conductive layers 108 and the N+ type region 102. The metal strip 114 electrically connects the conductive layers 108 (the gates of the transistors) together and to the N+ type region 102. A strip of P+ type conductivity, indicated by the line 116, is in the silicon layer 94 and extends between the P– type regions 98 and 100 to electrically connect the P– type regions 98 and 100 together. Thus, the semiconductor device 86 forms the ESD protection circuit 60 shown in FIG. 5.

Although the semiconductor device 86 is shown to have the P– type regions 98 and 100 electrically connected by a strip of a conductive region in the silicon layer 94, the P– type region 98 and 100 may be electrically connected by a strip of a metal such as shown in FIG. 3. Also, although the semiconductor device 86 is shown as having a single N+ type region 96 which forms part of both MOS transistors, the device may have separate N+ type regions which are electrically connected by a metal strip as shown in FIG. 4.

Thus, there is provided by the present invention an ESD protection circuit which includes two NPN lateral transistors connected in series with the emitter of one of the transistors being connected to the collector of the other transistors. The bases of the transistors are connected together and are floating so as to reduce the leakage current by ensuring an equal division of the voltage, without substantially raising the trigger voltage. This achieves the desirable characteristics of low leakage current and a virtually equal trigger and snap-back voltage. The circuit may be provided by two MOS transistors having the source of one transistor connected to the drain of the other transistor. The channels of the two transistors are connected together and are floating, and the gates of the two transistors are connected together and to one of the terminals of the device. When the ESD protection circuit of the present invention is used in a MOS circuit, forming the ESD protection circuit of MOS transistors has the advantage that the transistors of the protection circuit can be formed at the same time and by the same steps of forming the MOS transistors of the circuit being protected. However, the MOS transistors provide the desired lateral NPN transistors that are required for the ESD protection circuit of the present invention.

What is claimed is:

1. An ESD protection circuit comprising:

a pair of lateral NPN transistors each having an emitter, a collector and a base, the transistors are connected in series with the emitter of one of the transistors being connected to the collector of the other transistor;

a terminal connected to the collector of the one transistor;

a separate terminal connected to the emitter of the other transistor; and means electrically connecting the bases of the transistors so that they are floating.

2. The ESD protection circuit of claim 1 wherein the lateral transistors are formed by two MOS transistors each having N type source and drain and P type channel region; the source of one of the transistors being electrically connected to the drain of the other transistor, and the channel regions are electrically connected together.

3. The ESD protection circuit of claim 2 wherein each of the MOS transistors has a gate over the P–type channel region and the gates are electrically connected together and to one of the terminals.

4. A semiconductor device forming an ESD protection circuit comprising:

a substrate of single crystalline silicon having a surface;

a layer of an insulating material over the surface of the substrate;

a thin layer of single crystalline silicon over the insulating layer;

a pair of NPN lateral transistors in the silicon layer with each transistor having a pair of spaced N type conductivity regions and a P–type conductivity region between and contacting the N–type region;

one of the N–type regions of one of the transistors being electrically connected to one of the N–type regions of the other transistor; and means electrically connecting the P–type regions of the two transistors.

5. The semiconductor device of claim 4 wherein the N–type regions of the two transistors which are electrically connected together are separate regions spaced apart from each other and a strip of a metal extends between and electrically connects the N–type regions.

6. The semiconductor device of claim 4 wherein the lateral transistors are formed by two MOS transistors each having N–type conductivity source and drain regions, a P–type conductivity channel region therebetween and a gate over and insulating from each of the channel regions, the channel regions are electrically connected together and the gates are electrically connected together and to the N-type region of one of the transistors.

7. The semiconductor device of claim 4 wherein the two transistors have a single common N-type region.

8. The semiconductor device of claim 7 wherein the means connecting the P-type regions of the two transistors is a strip of P-type conductivity in the silicon layer and extending between the P-type regions.

9. The semiconductor device of claim 7 wherein the means connecting the P-type regions is a strip of metal extending between the P-type regions.

10. The semiconductor device of claim 9 including a layer of an insulating material over the silicon layer and having openings therethrough to the P-type regions and the metal strip extends over the insulating layer and through the openings to contact the P-type regions.

* * * * *